(12) United States Patent
Radens

(10) Patent No.: US 6,380,575 B1
(45) Date of Patent: *Apr. 30, 2002

(54) DRAM TRENCH CELL

(75) Inventor: Carl J. Radens, LaGrangeville, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/387,060

(22) Filed: Aug. 31, 1999

(51) Int. Cl.$^7$ ............... H01L 27/108; H01L 29/76; H01L 29/94; H01L 31/119
(52) U.S. Cl. ............... 257/296; 257/301; 257/302; 257/907; 257/908
(58) Field of Search ............... 257/296–310, 257/906–908; 438/243–253

(56) References Cited

U.S. PATENT DOCUMENTS

| | | | |
|---|---|---|---|
| 4,801,988 A | | 1/1989 | Kenney |
| 4,969,022 A | | 11/1990 | Nishimoto et al. |
| 5,065,273 A | | 11/1991 | Rajeevakumar |
| 5,182,224 A | | 1/1993 | Kim et al. |
| 5,292,678 A | * | 3/1994 | Dhong et al. ............... 438/243 |
| 5,309,008 A | | 5/1994 | Watanabe |
| 5,336,629 A | | 8/1994 | Dhong |
| 5,362,663 A | | 11/1994 | Bronner et al. |
| 5,384,277 A | | 1/1995 | Hsu et al. |
| 5,384,474 A | | 1/1995 | Park et al. |
| 5,395,786 A | * | 3/1995 | Hsu et al. ............... 438/248 |
| 5,426,324 A | | 6/1995 | Rajeevakumar |
| 5,432,365 A | | 7/1995 | Chin et al. |
| 5,461,248 A | | 10/1995 | Jun |
| 5,521,115 A | | 5/1996 | Park et al. |
| 5,555,520 A | | 9/1996 | Sudo et al. |
| 5,576,566 A | | 11/1996 | Kenney |
| 5,614,431 A | | 3/1997 | Debrosse |
| 5,658,816 A | | 8/1997 | Rajeevakumar |
| 5,670,805 A | | 9/1997 | Hammerl et al. |
| 5,698,878 A | * | 12/1997 | Miyashita et al. ........... 257/301 |
| 5,736,760 A | * | 4/1998 | Hieda et al. ............... 257/301 |
| 5,998,821 A | * | 12/1999 | Hieda et al. ............... 257/301 |
| 6,025,225 A | * | 2/2000 | Forbes et al. ............... 438/243 |
| 6,194,736 B1 | * | 2/2001 | Chaloux et al. ............ 257/301 |

FOREIGN PATENT DOCUMENTS

| | | | |
|---|---|---|---|
| EP | 0471337 A1 | * | 2/1992 |
| EP | 0720221 A1 | * | 3/1996 |

* cited by examiner

Primary Examiner—Tom Thomas
Assistant Examiner—Cuong Quang Nguyen
(74) Attorney, Agent, or Firm—McGinn & Gibb, PLLC; Daryl K. Neff, Esq.

(57) ABSTRACT

A method and structure for an integrated circuit chip includes storage devices, isolation regions adjacent the storage devices and surface straps connected to the storage devices, wherein the isolation regions have a border coincident with the surface straps.

16 Claims, 3 Drawing Sheets

DRAM TRENCH CELL

BACKGROUND OF THE INVENTION

1. Field of the Invention

The present invention generally relates to integrated circuit manufacturing techniques and more particularly to an improved method and structure to improve the conductive strap electrical connection between a storage device and a pass gate device.

2. Description of the Related Art

Integrated circuit devices such as dynamic random access memories (DRAM) are being continually reduced in size to decrease manufacturing costs and to increase speed. However, as the devices are scaled (e.g., reduced in size), the manufacturing tolerances including size control and positional overlay must be reduced. Therefore, as integrated circuits are scaled, defects resulting from improperly shaped or positioned items often result in circuits which do not perform as intended, reducing manufacturing yield.

In order to avoid such defects, open-bitline or hierarchical architectures are used to help chip area scaling. An open bitline cell may require a bitline that has a direction off-orthogonal to the wordline direction. A discontinuity of the array is required to change the direction of an off-orthogonal bitline. Such a discontinuity of the array will inflict an undesirable area penalty in the chip.

Other similar scaling processes may place the buried strap in direct proximity to the array device channel. If the buried strap is in direct proximity to the device channel, the buried strap outdiffusion region will interact with the array device source drain diffusion, and impact device performance such as off-current and threshold voltage.

Therefore, there is a need to reduce the size of integrated circuit devices and allow more devices to be placed on a chip, without comprising the functionality of the devices.

SUMMARY OF THE INVENTION

It is, therefore, an object of the present invention to provide a structure and method for an integrated circuit chip that includes storage devices, isolation regions adjacent the storage devices and surface straps connected to the storage devices, wherein the isolation regions have a border coincident with a border of the surface straps.

The isolation regions have a step-shape for accommodating the surface straps and have a comer which matches a comer of the surface straps. Thus, the isolation regions are free from interfering with a connection between the surface straps and the storage devices.

The storage devices and the isolation regions are formed on a substrate and the storage devices and the isolation regions define active areas in the substrate. The integrated circuit chip includes bitline contacts in the active areas. The integrated circuit chip includes serpentine gate conductors positioned between the surface straps and the storage devices. The storage devices can be deep trench storage devices and the surface strap connects the deep trench storage devices to transistors.

An inventive method for forming an integrated circuit chip includes forming storage devices, forming isolation regions adjacent the storage devices and forming surface straps connected to the storage devices, wherein the isolation regions are formed to have a border coincident with a border of the surface straps. The isolation regions are formed to have a step-shape for accommodating the surface straps and to have a comer which matches a comer of the surface straps. The isolation regions are formed to be free from interfering with a connection between the surface straps and the storage devices.

The invention increases the overlap area between the surface strap and the deep trench storage device which provides greater reliability of the connection, reduces the number of defects and increases manufacturing yields.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
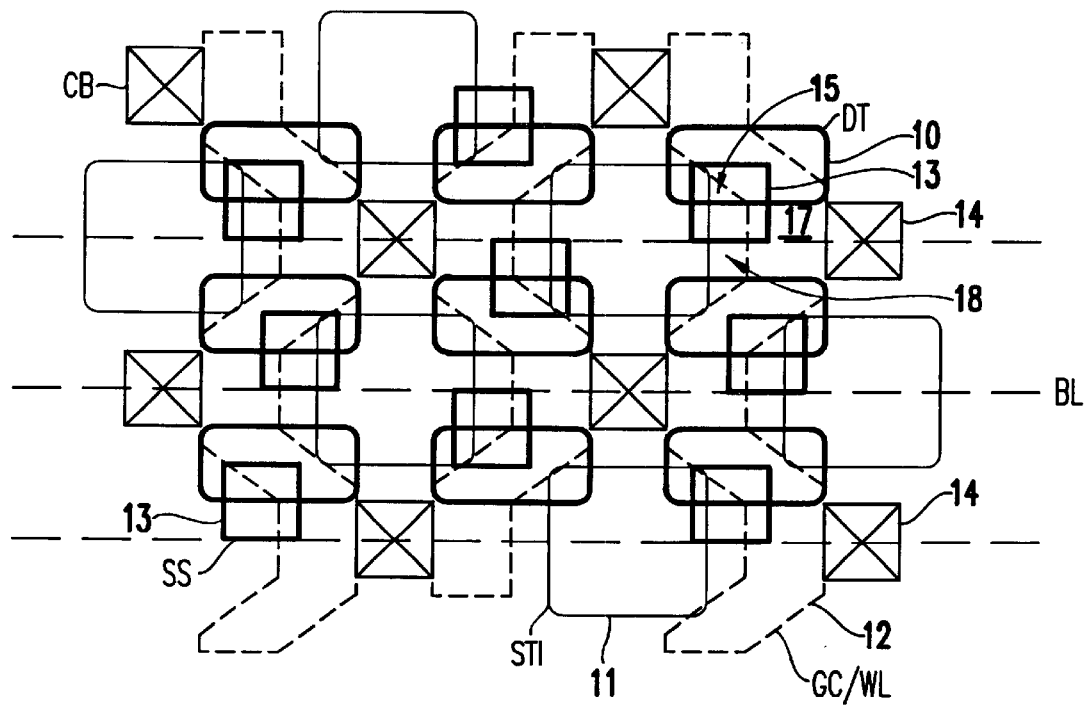
FIG. 1 is a schematic diagram of an integrated circuit structure.

Referring now to the drawings, and more particularly to FIG. 1, a conventional structure which is referred to herein as a shallow trench isolation (STI) and deep trench (DT) bounded structure is illustrated. The conventional structure includes deep trench storage devices 10, shown as rectangles in FIG. 1, formed in a silicon substrate. Shallow trench isolation regions 11, shown as large lightly shaded squares in FIG. 1, are formed after the deep trench structures 10. Islands 17 of silicon (e.g., active area) that are bordered by the deep trench structures 10 and the shallow trench isolation regions 11 are formed by this process.

Serpentine pattern gate conductors or wordlines (GC/WL) 12, represented by the dotted line in FIG. 1, are formed over and insulated from the deep trench structures 10 and the shallow trench isolation regions 11. Surface straps (SS) 13, shown as small squares in FIG. 1, are then formed over the structure. The surface straps 13 are insulated from the gate conductor 12 but are not insulated from the deep trench storage devices 10. Bitline contacts 14, are shown as small "X" squares in FIG. 1.

Transistors 18 are formed in the silicon islands 17. Each transistor has a channel region which lies under but is insulated from the GC/WL 12, a source region which lies under and is connected to the surface strap 13 and a drain region which lies under and is connected to the contact 14. Voltage in the GC/WL 12 selectively connects the deep trench 10 to the contact 14 by making the transistor conductive (allowing a circuit to be formed between the source (surface strap 13) and the drain (contact 14)).

However, the conventional structure illustrated in FIG. 1 suffers from the disadvantage that the portion of the surface strap 13 which contracts the deep trench storage device 10 is limited to the triangle portion 15 shown in FIG. 1. More specifically, the shallow trench isolation regions 11 and gate conductor 12 shield portions of the surface straps 13 from making contact with the deep trench storage devices 10. The small size of this triangle 15 may cause the connection between the surface strap 14 and the deep trench storage device 10 to be improperly formed.

Figure 2:
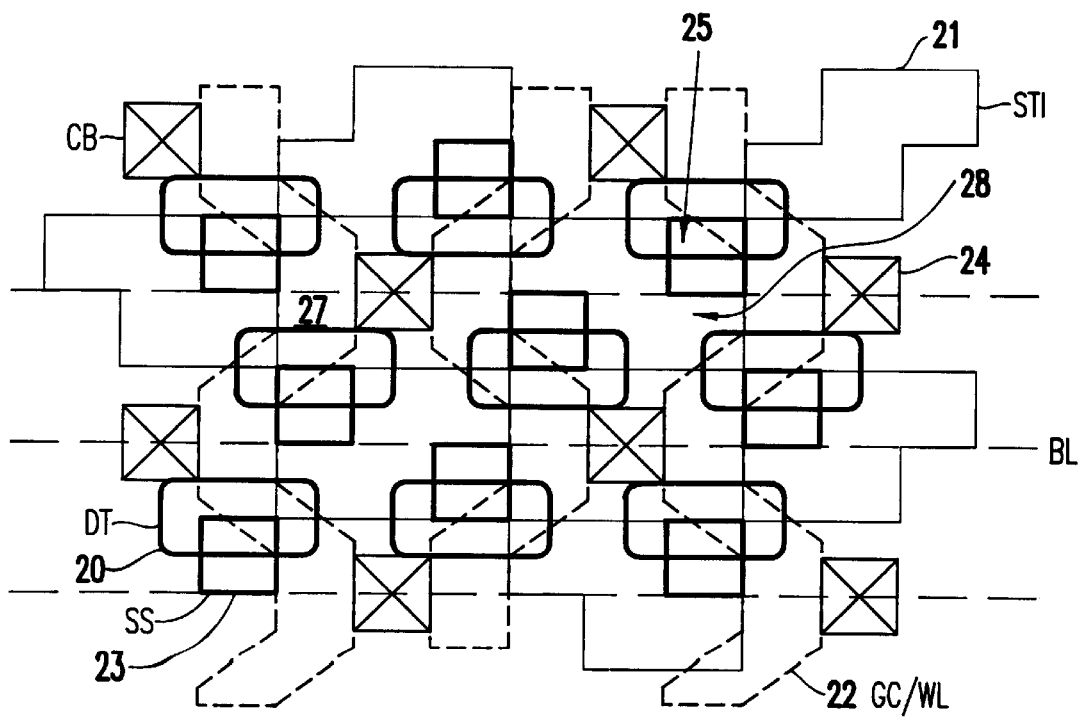
FIG. 2 is a schematic diagram of an integrated circuit structure.

Therefore, the inventive structure shown in FIG. 2 addresses this problem. In FIG. 2, the shallow trench isolation regions 21 have a "tilted" or stepped shape, and the rows of DT are also offset. More specifically, FIG. 2 illustrates deep trench storage devices 20, shown as rectangles in FIG. 2, formed in a silicon substrate. Shallow trench isolation (STI) regions 21, shown as large lightly shaded squares in FIG. 2, are formed after the deep trench structures 20. Islands 27 of silicon that are bordered by the deep trench structures 20 and the shallow trench isolation regions 21 are formed by this process. As with the structure shown in FIG. 1, a transistor 28 selectively connects the surface strap 23/deep trench 20 with the contact 24 depending upon the voltage in the GC/WL 22. Additional ion implantations and anneals of source/drain diffusion and wells will be understood by those skilled in the art to also have been formed, but have not been shown for clarity.

Figure 3:
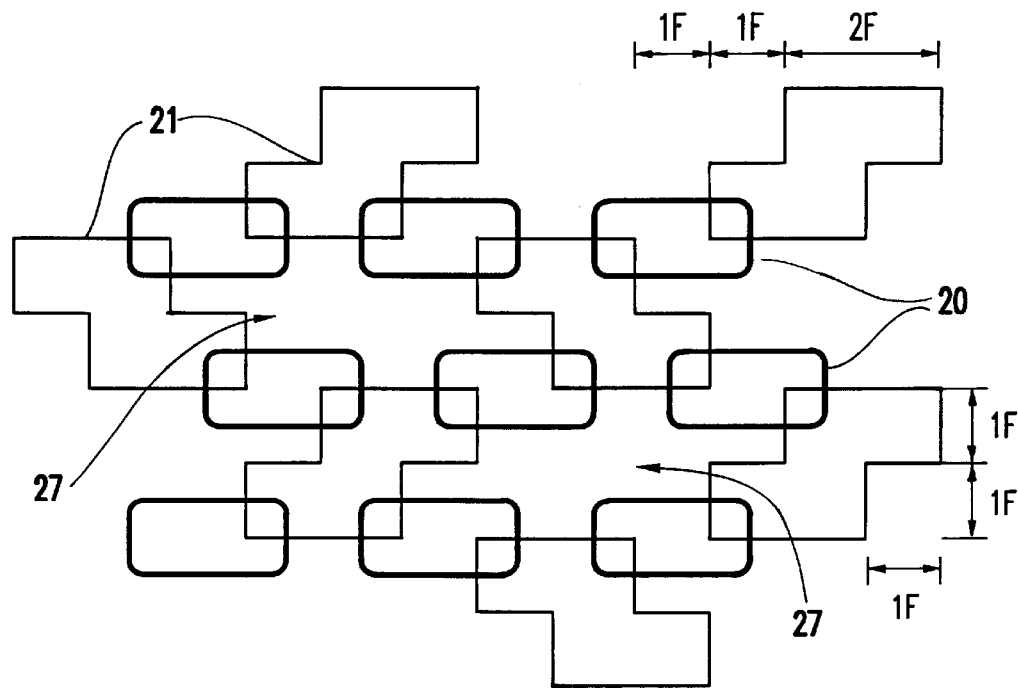
FIG. 3 is a schematic diagram of deep trench storage devices and a shallow trench isolation regions.

FIG. 3 more clearly illustrates the relationship of the deep trench storage devices 20, the shallow trench isolation regions 21 and the silicon islands 27. In the drawings, "F" is the minimum feature size which can be formed with lithographic patterning or one-half of the periodicity of the minimum line and space grating which can be formed using lithographic patterning. The corners of the shallow-trench isolation regions 21 should overlap the deep trench 20 by at least 0.5 F to assure manufacturing overlay margins.

Serpentine patterned gate conductors or wordlines (GC/WL) 22, represented by the dotted line in FIG. 2, are formed over and insulated from the deep trench structures 20 and the shallow trench isolation regions 21. Surface straps (SS) 23, shown as small squares in FIG. 2, are then formed over the structure. The surface straps 23 are insulated from the gate conductor 22 but are not insulated from the deep trench storage devices 20. The surface straps 23 form an electrical connection between the deep trench storage devices 20 and transistors source/drain 28 which are formed at the union of silicon islands 27 and GC/WL 22. Bitline contacts 24, which are shown as small "X" squares in FIG. 2, are formed adjacent each transistor 28 such that the transistor 28 selectively connects the surface strap 23 and the bitline contact 24.

The structure shown in FIG. 2 is advantageous when compared to the structure shown in FIG. 1 because the contact area 25 between the deep trench storage device 20 and the surface strap 23 is increased dramatically when compared to the overlap area 15 shown in FIG. 1. More specifically, the offset step-shape of the shallow trench isolation regions 21 provides a border (e.g. an edge) which is coincident with a border (e.g. an edge) of the surface straps 23. In this structure, the isolation regions 21 do not overlap the surface straps 23. Thus, the corner of the surface straps matches the corner of the shallow trench isolation regions 21 and the shallow trench isolation regions 21 do not interfere with the connection between the surface strap 23 and the deep trench storage device 20. Therefore, the structure shown in FIG. 2 will produce a more reliable contact between the surface strap 23 and the deep trench storage device 20, thereby decreasing defects and increasing manufacturing yield.

Figure 4:
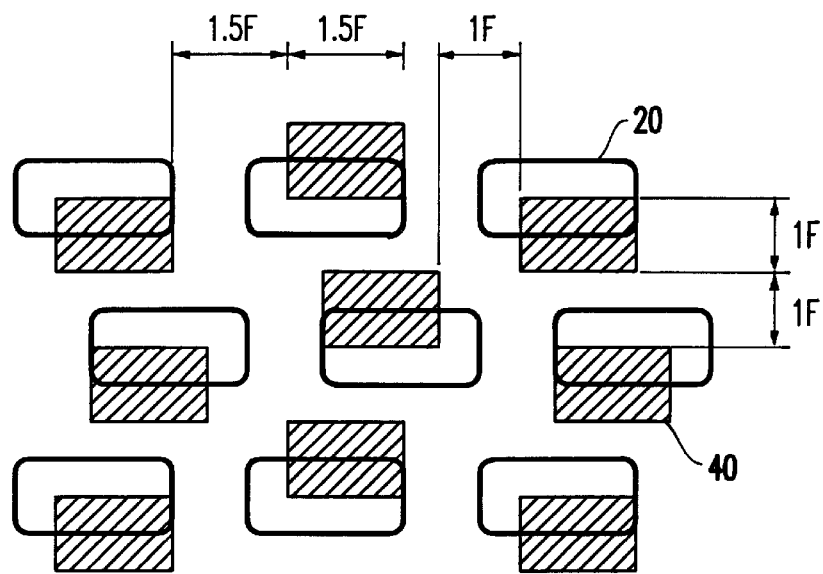
FIG. 4 is a schematic diagram of deep trench storage devices and surface straps.
Figure 5:
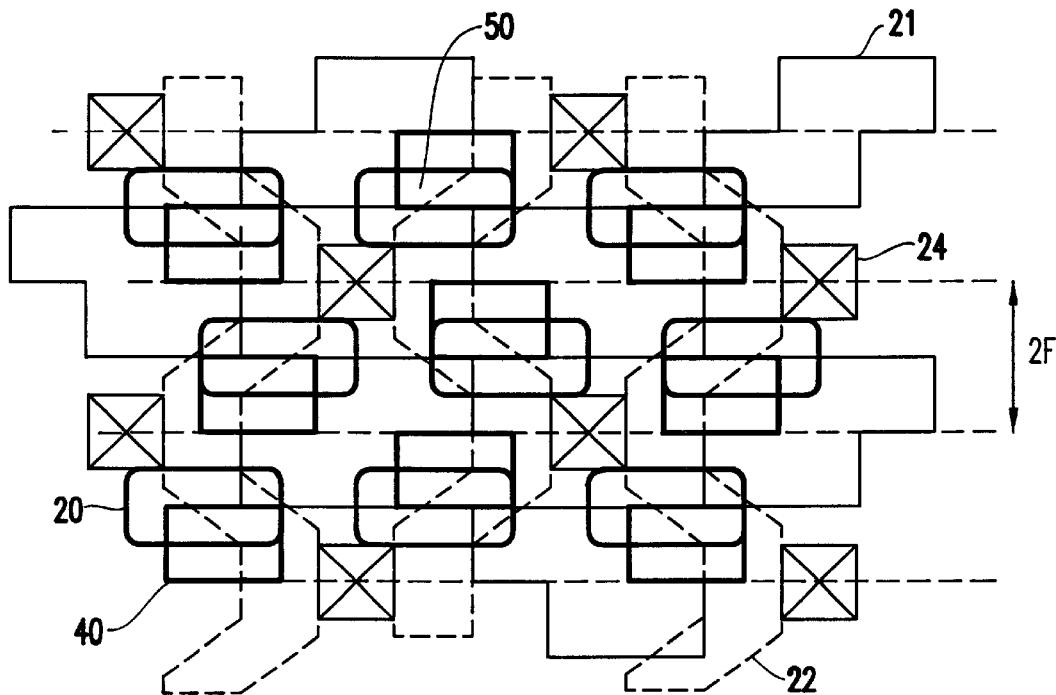
FIG. 5 is a schematic diagram an integrated circuit structure.

A second embodiment of the invention is shown in FIGS. 4 and 5. The items which are the same as those discussed above with respect to FIG. 2 are given the same identification numbers. FIG. 4 illustrates the deep trench storage devices 20 and larger surface straps 40. The surface straps 40 discussed above with respect to FIG. 2 are approximately 1.0 F×1.0 F while the surface straps shown in FIG. 4 are 1.5 F×1.0 F. The larger surface straps 40 provide an even greater overlap (areas 50) of the deep trench storage devices 20 and the surface straps 40, even when compared to the overlap area 25 discussed above with respect to FIG. 2. Therefore, this embodiment provides even greater reliability of the connection between the surface strap 40 and the deep trench storage device 20 which again, reduces the number of defects and increases manufacturing yields.

Figure 6:
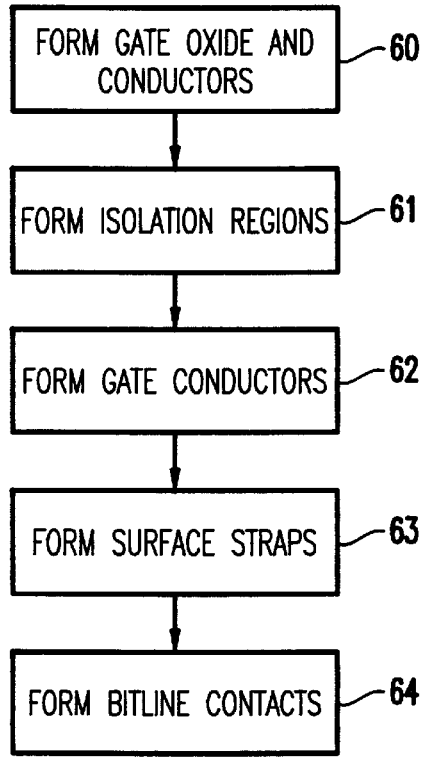
FIG. 6 is a flow diagram illustrating a preferred method of the invention.

One embodiment of the invention is shown in flowchart form in FIG. 6. More specifically, in item 60 the gate oxide and conductors are formed. Then the isolation regions 21 are formed, as shown in item 61. In item 62, gate conductors 22 are formed and, in item 63, surface straps 23 are formed. Finally, bitline contacts 24 are formed in item 64.

Thus, as discussed above, the invention increases the overlap area 25, 50 between the surface strap 23, 40 and the deep trench storage device 20 which provides greater reliability of the connection, reduces the number of defects and increases manufacturing yields.

While the invention has been described in terms of preferred embodiments, those skilled in the art will recognize that the invention can be practiced with modification within the spirit and scope of the appended claims.

What is claimed is:

1. An integrated circuit chip comprising:
    storage devices;
    isolation regions adjacent said storage devices; and
    surface straps connected to said storage devices,
        wherein said isolation regions have an offset step-shape, when viewed from a top-view of said integrated circuit chip, and
        wherein said step-shape increases a contact area between said surface straps and said storage devices.

2. The integrated circuit chip in claim 1, wherein said isolation regions have a corner which matches a corner of said surface straps.

3. The integrated circuit chip in claim 1, wherein said storage devices and said isolation regions are formed in a substrate and said storage devices and said isolation regions defme active areas in said substrate.

4. The integrated circuit chip in claim 3, further comprising bitline contacts in said active areas.

5. The integrated circuit chip in claim 1, further comprising serpentine gate conductors positioned between said surface straps and said storage devices.

6. The integrated circuit chip in claim 1, wherein said storage devices comprise deep trench storage devices and said surface strap connects said deep trench storage devices to transistors.

7. The integrated circuit chip in claim 1, wherein said storage devices comprise an array having columns and rows, and wherein said storage devices are alternatively offset in said rows, when viewed from a top-view of said integrated circuit chip.

8. The integrated circuit chip in claim 7, wherein said offset increases a contact area between said surface straps and said storage devices.

9. A dynamic random access memory array comprising:
    storage devices;
    isolation regions adjacent said storage devices; and
    surface straps connected to said storage devices,
        wherein said isolation regions have an offset step-shape, when viewed from a top-view of said integrated circuit chip, and wherein said step-shape increases a contact area between said surface straps ad said storage devices.

10. The dynamic random access memory array in claim 9, wherein said isolation regions have a comer which matches a comer of said surface straps.

11. The dynamic random access memory array in claim 9, wherein said storage devices and said isolation regions are formed in a substrate and said storage devices and said isolation regions defme active areas in said substrate.

12. The dynamic random access memory array in claim 3, further comprising bitline contacts in said active areas.

13. The dynamic random access memory array in claim 4, further comprising serpentine gate conductors positioned between said surface straps and said storage devices.

14. The dynamic random access memory array in claim 4, wherein said surface strap connects said storage devices to transistors.

15. The dynamic random access memory array in claim 9, wherein said storage devices are positioned in columns and rows, and wherein said storage devices are alternatively offset in said rows, when viewed from a top-view of said integrated circuit chip.

16. The dynamic random access memory array in claim 15, wherein said offset increases a contact area between said surface straps and said storage devices.

* * * * *